(12) United States Patent
Wadhwa et al.

(10) Patent No.: US 12,267,075 B2
(45) Date of Patent: *Apr. 1, 2025

(54) LOW-POWER INTER-DIE COMMUNICATION USING DELAY LINES

(71) Applicant: QUALCOMM Incorporated, San Diego, CA (US)

(72) Inventors: Sameer Wadhwa, San Diego, CA (US); Lennart Karl-Axel Mathe, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,942

(22) Filed: May 25, 2023

(65) Prior Publication Data

US 2024/0056067 A1    Feb. 15, 2024

Related U.S. Application Data

(63) Continuation of application No. 17/887,282, filed on Aug. 12, 2022, now Pat. No. 11,695,400.

(51) Int. Cl.
*H03K 5/00* (2006.01)
*H03K 5/14* (2014.01)
(Continued)

(52) U.S. Cl.
CPC ............. *H03K 5/14* (2013.01); *H03K 5/1534* (2013.01); *H03K 5/19* (2013.01); *H03K 5/15033* (2013.01); *H03K 5/1504* (2013.01); *H03K 5/1536* (2013.01)

(58) Field of Classification Search
CPC .......... H03K 5/14; H03K 5/1534; H03K 5/19; H03K 5/15033; H03K 5/1504; H03K 5/1536; H03M 9/00
See application file for complete search history.

(56) References Cited

U.S. PATENT DOCUMENTS 5,349,612 A * 9/1994 Guo .................. H04J 3/0685
375/374
5,414,830 A    5/1995 Marbot
(Continued)

FOREIGN PATENT DOCUMENTS

| EP | 0313875 A2 | 5/1989 |
| JP | 08-507668 A | * 8/1966 |
| JP | 8-507668 | * 8/1996 |

OTHER PUBLICATIONS

International Search Report and Written Opinion—PCT/US2023/068733—ISA/EPO—Sep. 27, 2023.

*Primary Examiner* — Tuan T Lam
(74) *Attorney, Agent, or Firm* — Loza & Loza, LLP

(57) ABSTRACT

A low-power phase interpolator circuit has a phase generator that receives an input clock signal and uses the input clock signal to generate multiple intermediate clock signals with different phase shifts; a phase rotator circuit that outputs phase-adjusted clock signals, each phase-adjusted clock signal having a phase that lies within a range bounded by phases of two of the intermediate clock signals; a frequency doubler circuit that receives a plurality of the phase-adjusted clock signals and outputs two frequency-doubled clock signals having a 180° phase difference; and a quadrature clock generation circuit that receives the two frequency-doubled clock signals and provides four output signals that include in-phase and quadrature versions of the two frequency-doubled clock signals.

28 Claims, 11 Drawing Sheets

(51) Int. Cl.
    *H03K 5/1534*     (2006.01)
    *H03K 5/19*     (2006.01)
    *H03K 5/15*     (2006.01)
    *H03K 5/1536*     (2006.01)

(56) References Cited

U.S. PATENT DOCUMENTS

| | | | |
|---|---|---|---|
| 6,031,473 A * | 2/2000 | Kubinec | H03M 9/00 |
| | | | 341/100 |
| 6,417,790 B1 | 7/2002 | Fiedler et al. | |
| 7,006,021 B1 | 2/2006 | Lombaard | |
| 7,468,685 B1 * | 12/2008 | Macaluso | H03M 9/00 |
| | | | 341/101 |
| 8,912,933 B1 | 12/2014 | Zhang et al. | |
| 9,680,501 B1 * | 6/2017 | Li | H03M 9/00 |
| 10,902,904 B1 * | 1/2021 | Mitsubori | G11C 11/4096 |
| 11,695,400 B1 | 7/2023 | Wadhwa | |
| 2006/0164266 A1 * | 7/2006 | Riedel | H04N 21/8547 |
| | | | 375/E7.278 |
| 2009/0167573 A1 | 7/2009 | Kim et al. | |
| 2009/0182912 A1 * | 7/2009 | Yoo | H04L 5/245 |
| | | | 710/71 |
| 2011/0057820 A1 | 3/2011 | King | |
| 2013/0187799 A1 | 7/2013 | Chang | |
| 2014/0035642 A1 * | 2/2014 | Venkata | H03K 5/1534 |
| | | | 327/162 |
| 2015/0123826 A1 | 5/2015 | Lee et al. | |
| 2017/0060218 A1 * | 3/2017 | Zhang | G06F 1/324 |
| 2017/0279461 A1 | 9/2017 | Lin et al. | |

\* cited by examiner

LOW-POWER INTER-DIE COMMUNICATION USING DELAY LINES

CROSS-REFERENCE TO RELATED APPLICATIONS

The present Application for Patent is a Continuation of pending U.S. Non-Provisional Application Ser. No. 17/887,282, filed Aug. 12, 2022, which issued as U.S. Pat. No. 11,695,400 and which is assigned to the assignee hereof and hereby expressly incorporated by reference herein as if fully set forth below and for all applicable purposes.

TECHNICAL FIELD

The present disclosure generally relates to serial communication between integrated circuits and, more particularly, to efficient, compact low-power serializer and deserializer circuits.

BACKGROUND

Electronic device technologies have seen explosive growth over the past several years. For example, growth of cellular and wireless communication technologies has been fueled by better communications, hardware, larger networks and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In some instance, the serial communication link is deployed between dice on a chip carrier. Increased capabilities and complexity of hardware and software functions implemented in IC devices has resulted in continuously increasing demand for higher data throughput with lower power consumption. There is an ongoing need for new techniques that provide reliable lower-power SERDES circuits for use in high-speed serial links.

SUMMARY

Certain aspects of the disclosure relate to circuits, systems, apparatus, methods and techniques that support high speed serial communications within and between IC devices. A low-power, high-speed serializer circuit is disclosed that can reduce power consumption in a transmitting device. Low-power, high-speed deserializer circuits are disclosed that can reduce power consumption in a receiving device.

In various aspects of the disclosure, a serializer includes a delay line, a plurality of buffers and a clock generation circuit. The delay line has a plurality of serially-coupled delay stages. The delay line is configured to output N delay line signals that are versions of an input signal and include outputs of the plurality of serially-coupled delay stages. The plurality of buffers is coupled to a data source. Each buffer is enabled by a corresponding delay line signal and configured to couple a signal representing an associated bit from the data source to a data line of a serial communication link while a pulse is present in the corresponding delay line signal. A clock generation circuit responsive to edges in two of the N delay line signals is configured to generate a transmit clock signal to be transmitted over a clock line of the serial communication link.

In various aspects of the disclosure, a method for serializing data includes using a delay line to generate N delay line signals that are versions of an input signal provided to the delay line, providing the N delay line signals to a plurality of buffers coupled to a data source, and coupling a transmit clock signal to a clock line of a serial communication link. Each buffer in the plurality of buffers is enabled by a corresponding delay line signal and configured to couple a signal representing an associated bit from the data source to a data line of the serial communication link while a pulse is present in the corresponding delay line signal. The transmit clock signal is generated using edges in two of the N delay line signals.

In various aspects of the disclosure, a deserializer includes one or more delay lines, a plurality of latches and a clock generation circuit. The delay lines are configured to output N delay line signals. Each delay line signal is a version of an input signal provided to one of the delay lines. The plurality of latches is coupled to a data line of a serial communication link. Each latch is enabled by a corresponding one of the N delay line signals. Each latch is configured to capture state of the data line while a pulse is present in the corresponding delay line signal. The clock generation circuit is configured to produce a regenerated transmit clock signal using edges in two of the N delay line signals. The regenerated transmit clock signal corresponds to a clock signal received from a clock line of the serial communication link. Pulses in the input signal of each of the delay lines are generated from edges in the clock signal received from the clock line.

In various aspects of the disclosure, a method for deserializing data includes using one or more delay lines to generate N delay line signals, providing the N delay line signals to N latches coupled to a data line of a serial communication link and regenerating a transmit clock signal using edges in two of the N delay line signals. Each delay line signal is a version of an input signal provided to one of the one or more delay lines. Each latch is enabled by a corresponding delay line signal and configured to capture state of the data line while a pulse is present in the corresponding delay line signal. The transmit clock signal corresponds to a clock signal received from a clock line of the serial communication link. Pulses in the input signal of the delay line are generated from edges in the received clock signal.

DETAILED DESCRIPTION

Figure 1:
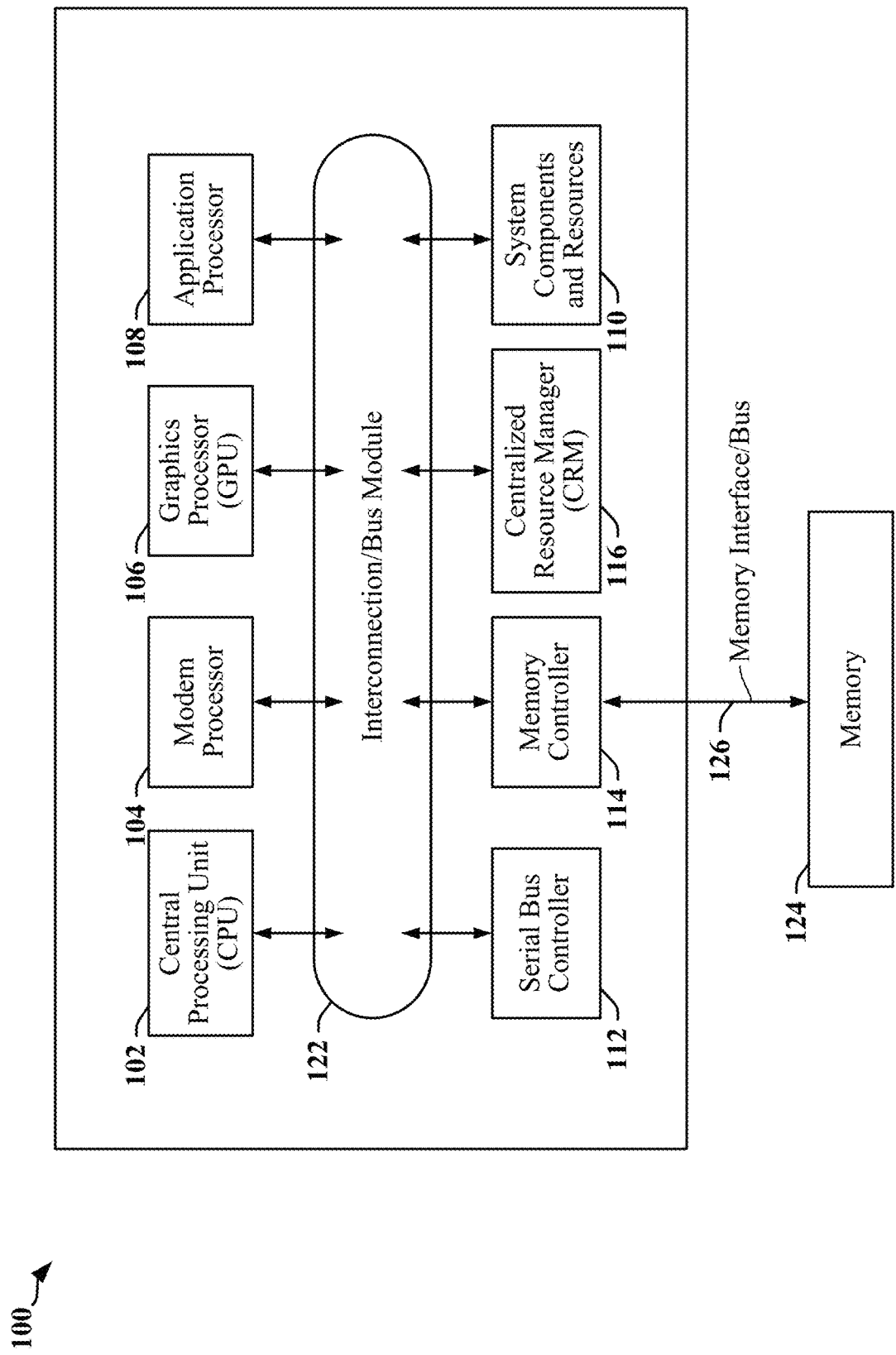
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
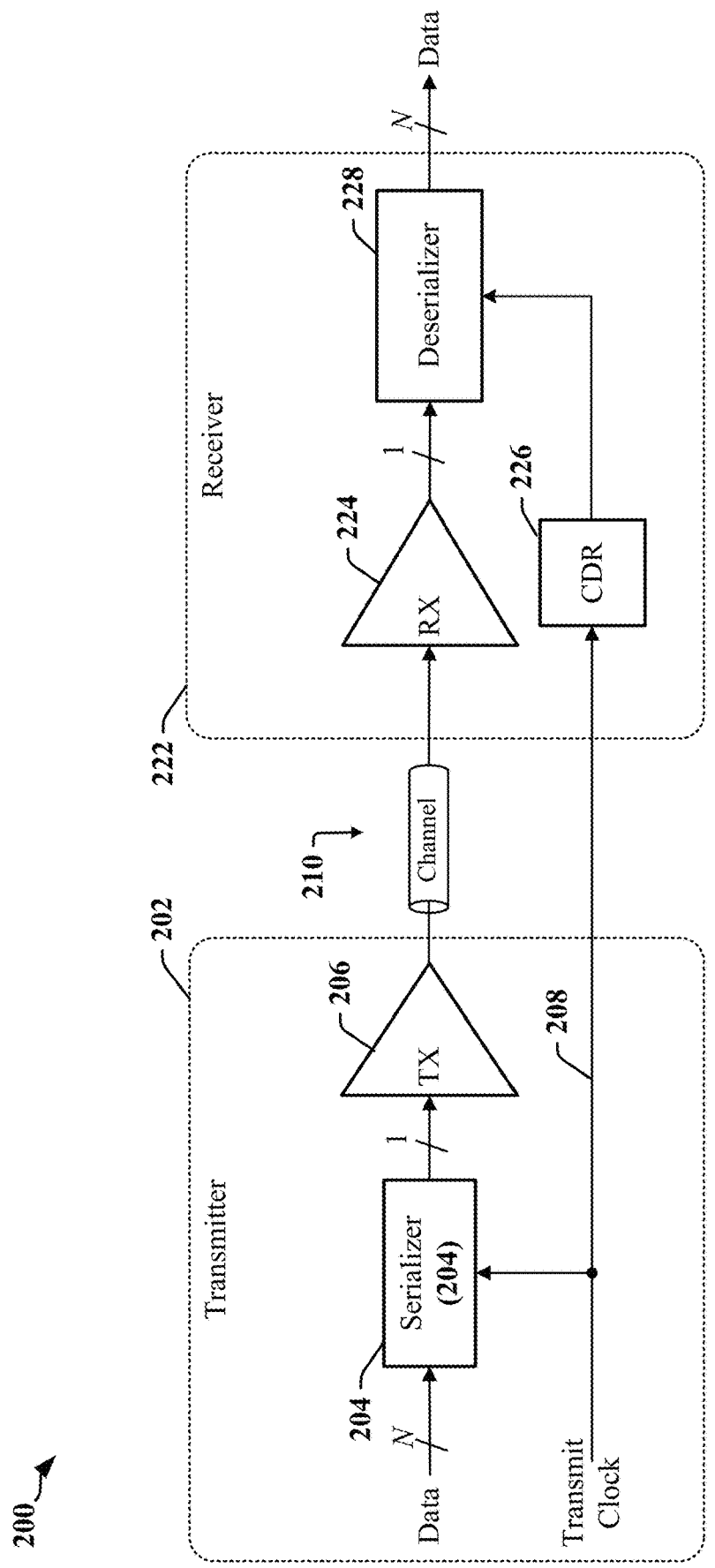
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which the data signal propagates from the first device to the second device. The receiver 222 may be provided in the second device and may be configured to receive and process the data signal.

In one example, the transmitter 202 includes a serializer 204 configured to convert N-bit parallel data into a serial data stream. The transmitter 202 further includes a transmit driver 206 configured to generate a data signal representative of the serial data stream for transmission to the receiver 222 through the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc. Certain aspects of this disclosure are applicable to serial communications between two dice provided on a chip-carrier. In some instances, the two dice may be coupled using a trace that has a length measurable as one or more millimeters. In some instances, the two dice may be coupled using a trace that has a length measurable as a fraction of a millimeter. In the latter example, the data communication channel 210 includes the millimeter-scale trace, input/output pads, interconnects, vias and traces within semiconductor devices.

The receiver 222 includes a receiving circuit (receiver 224), a clock data recovery circuit (the CDR 226) and a deserializer 228. In some implementations, the receiver 222 includes circuits configurable to perform equalization and amplification of the received data signal. Equalization circuits can boost the higher frequency components of a signal received from the data communication channel 210 in order to bring all frequency components of the signal to a similar amplitude and improve jitter. The CDR 226 is configured to receive a transmit clock signal 208 and to generate receive clock signals that can be used to sample or otherwise recover the serial data from the data signal based on information in the transmit clock signal 208. The CDR 226 may be configured to generate multiple signals from the transmit clock signal 208 received from the transmitter 202. The deserializer 228 is configured to convert the serial data back into parallel data.

The data signal or transmit clock signal 208 may be distorted when it arrives at the receiver 222. Distortion may arise for various reasons including impedance mismatches in the data communication channel 210, interference and reflected energy. Signal distortion can make it difficult to recover the clock and the data by the CDR 226 and can limit the window of stability during which data can be sampled. In some examples, distortion caused by high frequency attenuation can be addressed by equalization and amplification that increases the high frequency components of the data signal in order to increase the data rate at which the data signal may be sent through the data communication channel 210 and reliably recovered at the receiver 222. Distortion can produce timing errors and can introduce timing uncertainty or jitter that can compromise data the operation of the deserializer 228.

Improvements in semiconductor device technology and ever-increasing demand for performance in mobile communication devices and other battery-powered devices often necessitates increased data communication rates between IC devices. Increased data communication rates that are obtained through increased data transmission rates can significantly increase power consumption and decrease the maximum or rated operating time between battery charging events. A general-purpose serial link architecture consumes approximately 1 picoJoule per bit (pJ/bit) in the 10-20 gigabit per second (Gbps) data rate range. Certain aspects of this disclosure can deliver high data rate communication at lower power levels, including in data communication links that can be used for a die-to-die communication links within the same package.

In some aspects of the disclosure, power consumption can be reduced by limiting the number of logic and driver devices that switch at the highest clock frequencies employed by a communication interface. In some aspects of the disclosure, the frequency of the clock signal transmitted between IC devices can be less than the frequency at which data bits are transmitted over a serial bus.

Figure 3:
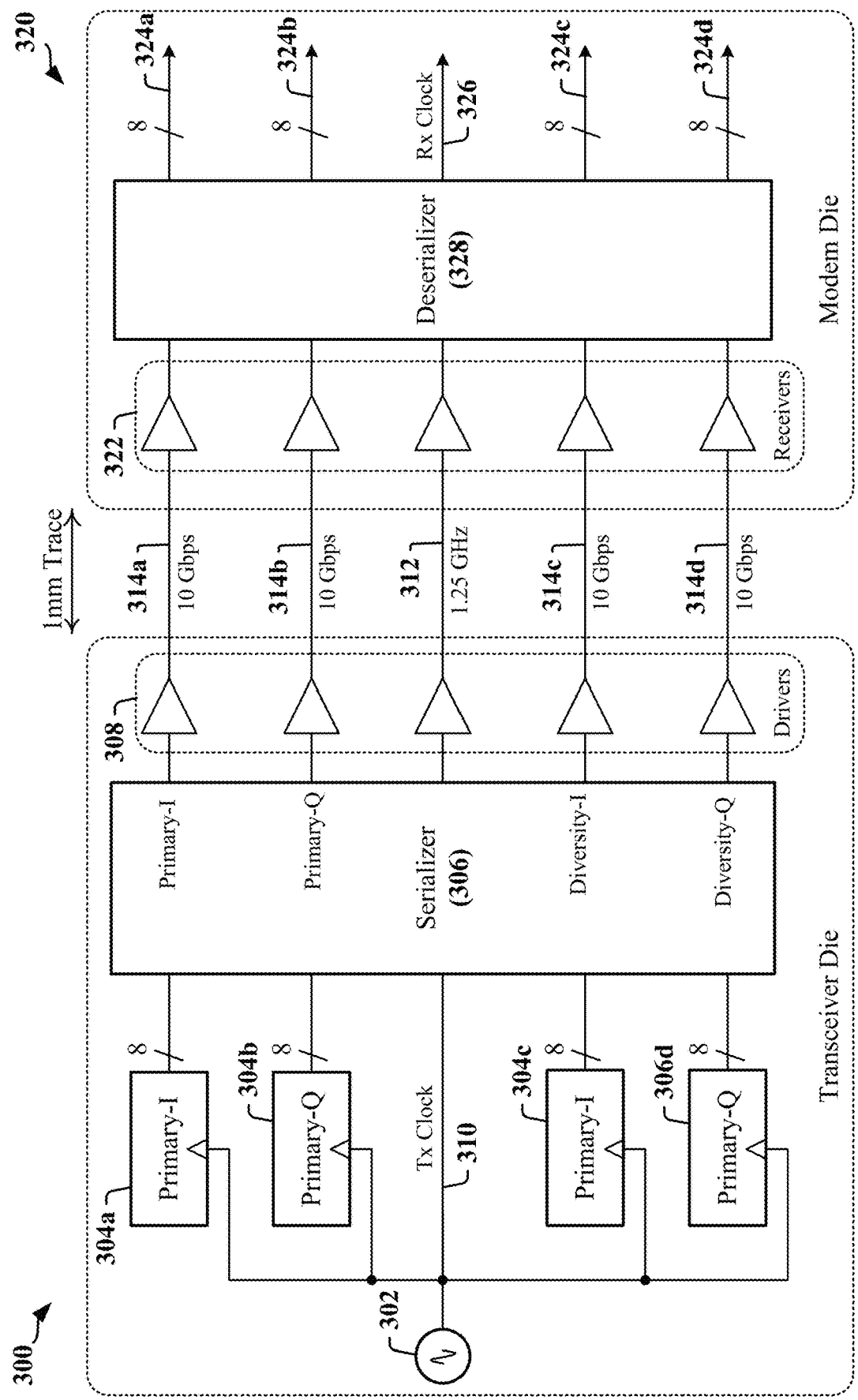
FIG. 3 illustrates an architecture for a serial interface that may be adapted or configured in accordance with certain aspects of this disclosure.

FIG. 3 illustrates an architecture for a serial interface that may be adapted or configured in accordance with certain aspects of this disclosure to obtain high data rate communication at lower power levels. In the illustrated example, the serial interface can deliver 40 Gbps data throughput between a transceiver die 300 and a modem die 320 using four serial data lines 314a, 314b, 314c and 314d that are each configured for 10 Gbps operation and a clock line 312 that carries a 1.25 MHz clock signal. The reduced frequencies of the signals transmitted over the serial data lines 314a-314d and the clock line 312 with respect to the overall data throughput can eliminate the need for shielding between the serial data lines 314a-314d and/or the clock line 312 and permit the serial data lines 314a-314d and the clock line 312 to be implemented using single ended line drivers and line receivers. In some applications, it may be desirable to implement the serial data lines 314a-314d and/or the clock line 312 using differential line drivers and line receivers. For example, differential signals may be used in interfaces that include longer lines or interconnects and/or when levels of electromagnetic interference can disrupt, distort or otherwise compromise transmissions single-ended lines.

In the transceiver die 300, four sources of parallel data 304a, 304b, 304c, 304d may be provided. In the illustrated example, the sources of parallel data 304a-304d are implemented using 8-bit latches clocked by a transmit clock signal 310 that has a frequency of 1.25 MHz. In other examples, the sources of parallel data 304a-304d may be implemented using registers, shift registers, and/or bus interface circuits. The transmit clock signal 312 may be generated using a clock generator 302. The clock generator 302 may include a variable oscillator, pulse generator, delay-locked loop (DLL), phase-locked loop (PLL), and/or other suitable clock generation circuit.

In the illustrated example, the outputs of the sources of parallel data 304a-304d are provided to a multi-channel serializer 306 that is configured to provide four serial data streams, each data stream being derived from the output of a corresponding source of parallel data 304a, 304b, 304c or 304d. The bit rate of each data stream is 8×1.25 GHz=10 GHz. A set of single-ended line drivers 308 includes four drivers configured to drive the four serial data lines 314a-314d and a driver configured to drive the clock line 312.

In the modem die 320, a set of single-ended line receivers 322 includes four data line receivers configured to couple a multi-channel deserializer 328 to the four serial data lines 314a-314d and a clock line receiver configured to couple the multi-channel deserializer 328 to the clock line 312. The deserializer derives a receive clock signal 326 from the signal received from the clock line 312 and uses timing information derived from a signal received from the clock line 312 to deserialize the serial data streams received from the four serial data lines 314a-314d. The deserialized data is output as four 8-bit representations 324a, 324b, 324c and 324d of the data provided by the sources of parallel data 304a-304d in the transceiver die 300. The receive clock signal 326 may be used to sample or capture the parallel data output by the deserializer 328.

Shift registers or series-connected flip-flops are commonly used to implement serializers and deserializers in conventional serial interfaces. In one example of a conventional serializer, N-bit parallel data is loaded into N series-connected flipflops that are clocked by a common clock signal. The output of each flip flop is typically connected to the input of a next flipflop in the series, with the output of the N-th series-connected flipflop providing the serialized output. Similarly, a conventional deserializer receives a serial data input at a first-in-series flipflop in a set of N series-connected flipflops that are clocked by a common clock signal. The output of each flip flop is typically connected to the input of a next flipflop in the series. After N clock cycles, N-bit parallel data can be read from the combined outputs of the N series-connected flipflops. In these conventional serializers and deserializers, N flipflops are clocked at the serial transmit clock frequency in both the transmitter and the receiver, and the flipflops can be a major consumer of power during serial data link operations.

According to certain aspects of this disclosure, a serial interface may be operated using serializers and deserializer implemented without flipflops. Serializers and deserializers configured in accordance with certain aspects disclosed herein employ delay lines and clock regeneration circuits. The clock regeneration circuits can limit jitter accumulation to a half-cycle or less of the transmitter or receiver clock signal. In some implementations, power consumption at data rates of 40 Gbps can be less than 0.15 pJ/bit, which compares favorably to the 1 pJ/bit observed in conventional interfaces that operate at 10-20 Gbps.

Figure 4:
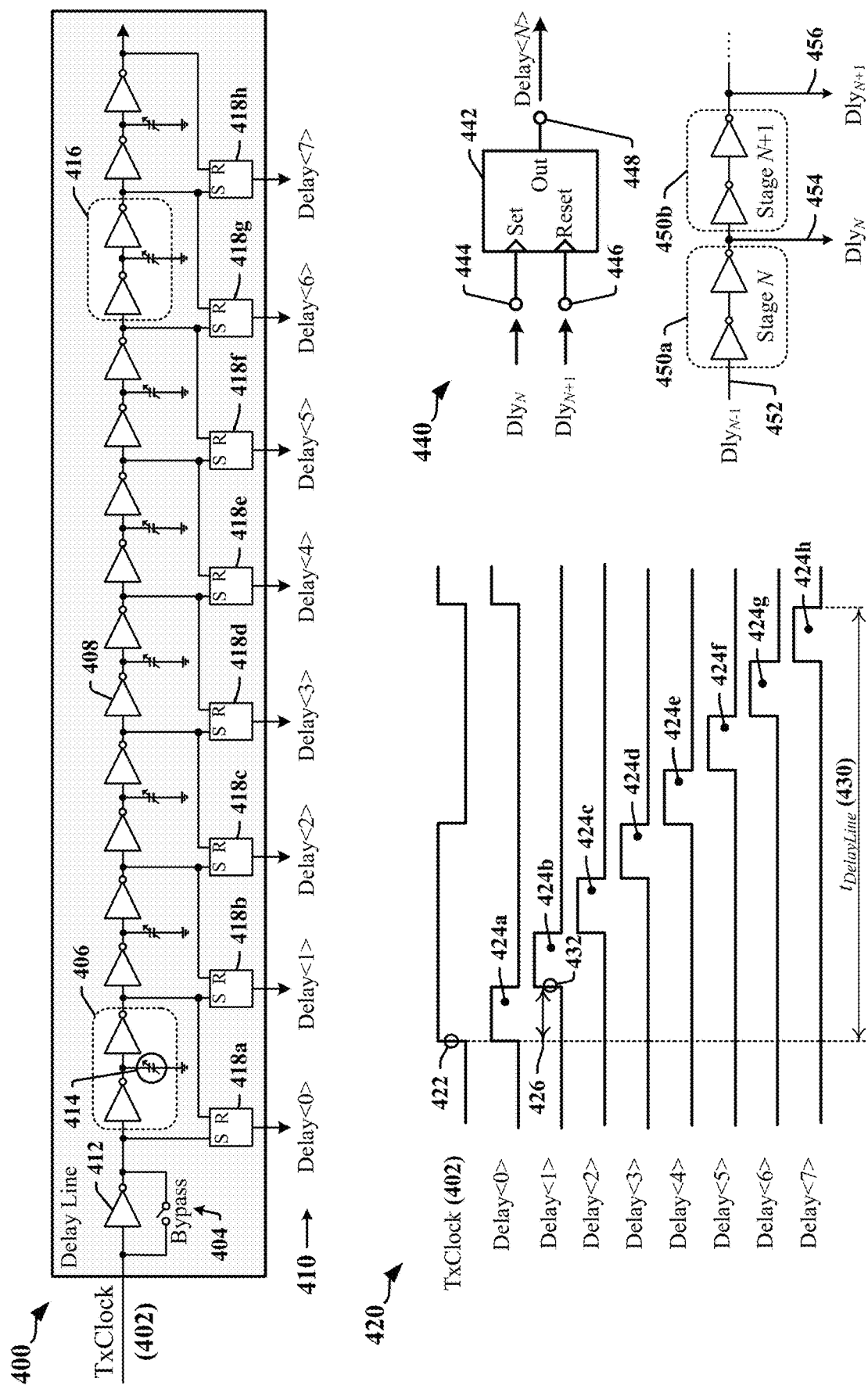
FIG. 4 shows an example of a delay line that may be employed or adapted in accordance with certain aspects of this disclosure.

FIG. 4 shows one example of a delay line 400 that may be configured in accordance with certain aspects of this disclosure. In some implementations, other types or configurations of delay lines may be used. Here, the illustrated delay line 400 is implemented using inverters, including the delay line inverter 408 and the phase select inverter 412. The phase select inverter 412 is coupled to the input of the delay line 400 and may be bypassed using a bypass switch 404. The phase select inverter 412 can be used to select between a noninverted (in-phase) signal and an inverted signal (180° out-of-phase) to drive the delay line 400.

The delay line 400 may be configured to receive a single-ended signal at an input and to provide multiple output signals 410 that are delayed versions of the input signal, and that are produced using a series of stages. In certain examples, each stage includes at least one delay element, such as delay element 406 or delay element 416 and an output element 418a-418h. In various implementations, the delay elements 406, 416 are configurable, in that the provided delay may be adjusted to some extent. In the illustrated example, a variable capacitor 414 can be used to vary capacitance of an interconnect between gates or inverters and thereby adjust the delay provided by the delay element 406. In other examples, the delay provided by delay element 406 can be adjusted by configuring one or more variable resistors in the delay element 406. In other examples, the delay introduced by delay element 406 can be adjusted by configuring the bias of one or more transistors in the delay element 406. In some implementations, one or more delay elements 406 can be configured during a calibration or configuration process to provide a desired delay. In one example, calibration may be performed to limit the variation in delays provided by delay elements in the delay line 400. The delay line 400 may include any number of delay elements. In other implementations, calibration may be performed to limit the variation in aggregated delay between two groups of delay elements to obtain a desired duty cycle, for example. In some implementations, the delay line is provided using circuits that have closely matched characteristics and the delay elements can provide matched delays without the need for calibration.

In the illustrated example, the output signals 410 provided by the delay line 400 include eight signals that are delayed with respect to one another. Seven delay elements (e.g., delay elements 406 and 416) each provide a same nominal delay. The delay line 400 may be configured to produce phase shifted versions or delayed versions of a signal.

The timing diagram 420 illustrates an example of the operation of the delay line 400 in accordance with certain aspects of this disclosure. In the illustrated example, a transmit clock signal (TxClock 402) may be received at an input of the delay line 400. TxClock 402 may be received from a processing circuit or sequencer that feeds data to a serializer in which the delay line 400 is incorporated or included. According to certain aspects of this disclosure, TxClock 402 has a period that defines, or is defined by the time required to serialize a byte of data, which may correspond to $t_{DelayLine}$ 430. In the illustrated example, the delay line 400 is configured to respond to a rising edge 422 in TxClock 402 by producing a set of delayed versions of a signal, where each delayed version of the signal includes a pulse 424a-424h that is one-eighth (⅛th) the duration of $t_{DelayLine}$ 430. In other examples, the rising edge 422 in TxClock 402 may cause the delay line 400 to generate a different or selectable number of (N) of delayed versions of a signal that includes a pulse that is 1/Nth the duration of $t_{DelayLine}$ 430.

The rising edge 422 in TxClock 402 produces a change in the signaling state at the input of the delay line 400, which transitions from a low state to a high state. In the illustrated example, the delay line 400 can be configured to respond to rising edges in TxClock 402 when the bypass switch 404 is turned on, thereby causing TxClock 402 to bypass the phase select inverter 412. The delay line 400 can also be configured to respond to falling edges in TxClock 402 when the bypass switch 404 is turned off, thereby causing the phase select inverter 412 to invert TxClock 402. Each stage provides a delayed version of an output signal, and the pulses 424a-424h in the delayed versions each have a duration that is ⅛th the duration of $t_{DelayLine}$ 430.

In one aspect of the disclosure, the duration of the pulses 424a-424h closely matches the duration ($t_{delay}$) of the delay 426 provided by each delay element in the delay line 400. Each of the output elements 418a-418h may be configured to terminate the pulse output by its corresponding delay element at the leading edge of a pulse generated by the next delay stage in the delay line. An example of a pulse control circuit 440 that may be included in the output elements 418a-418h is illustrated in FIG. 4. Some implementations use different types of circuits for pulse control in accordance with certain aspects of this disclosure. The illustrated example of a pulse control circuit 440 limits the duration of output pulses to the duration of the delay 426 provided by the stages of the delay line 400. The pulse control circuit 440 is based on a set-reset circuit 442 that responds to edges detected at a pair of inputs 444, 446. A rising edge at a set input 444 sets the output 448 of the set-reset circuit 442 to a high signaling state and a rising edge at a reset input 446 resets the output 448 of the set-reset circuit 442 to a low signaling state.

For use in the illustrated delay line 400, the set input 444 of the set-reset circuit 442 is coupled to the output 454 ($Dly_N$) of a first delay stage 450a and the reset input 446 of the set-reset circuit 442 is coupled to the output 456 ($Dly_{N+1}$) of a second delay stage 450b that follows, or is downstream of the first delay stage 450a. The input to the first delay stage 450a is the output 452 ($Dly_{N-1}$) of the preceding delay stage (not shown), except when the first delay stage 450a corresponds to delay element 406 in which case the input is coupled to TxClock 402. A rising edge in $Dly_N$ causes the output 448 of the set-reset circuit 442 to be driven to a high signaling state. The rising edge in $Dly_N$ propagates through the second delay stage 450b and the output 448 of the set-reset circuit 442 is reset when a rising edge occurs in $Dly_{N+1}$. The duration of the pulse output by the set-reset circuit 442 closely matches the duration of the delay provided by the first delay stage 450a.

In the illustrated example, the pulse control circuit 440 responds to edges in signals provided to its inputs 444, 446. This example is provided to facilitate description of certain aspects of the delay line 400. Other circuits may be used to control pulse width in accordance with certain aspects of this disclosure. For example, the output elements 418a-418h in some implementations may include gating logic configured to terminate a pulse at the output of a delay element when a high signaling state is present on any of a number of the following delay elements. For example, gating logic may be configured to terminate a pulse by driving the output of an Nth delay element to a low signaling state when a high signaling state is present on any of the three or more next delay elements in the delay line 400, including the Nth+1 delay element, the Nth+2 delay element and the Nth+3 delay element. In the latter example, the value of N may be a modulo 8 number.

In the illustrated delay line 400, the rising edge 422 in TxClock 402 propagates through seven delay elements, where the last delay element 416 produces a pulse that terminates after a time ($t_{DelayLine}$ 430). The duration of $t_{DelayLine}$ 430 can be calculated as:

$$t_{DelayLine} = 8 \times t_{Delay}.$$

According to one aspect, a version of the delay line 400 may be configured to operate as a DLL that functions as a clock generator. The delay line 400 can be configured to operate as a DLL by coupling an output of a delay element 416 to the input of the delay line 400 to form a loop. The bypass switch 404 may be configured to ensure that an odd number of serially connected inverters is provided in the loop. The resultant DLL oscillates at a frequency determined by the delays introduced by the delay elements in the loop.

Figure 5:
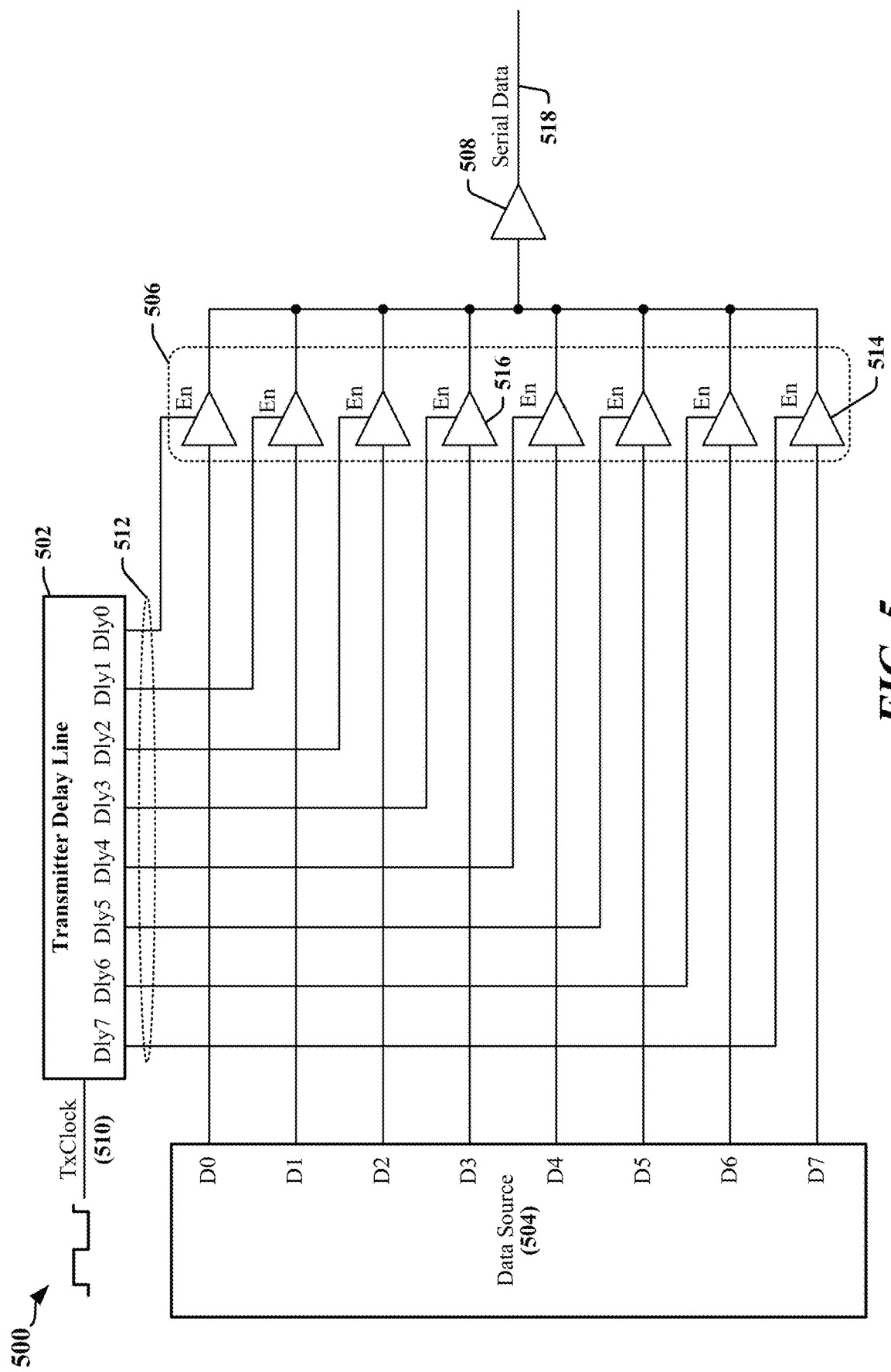
FIG. 5 illustrates a serializer configured in accordance with certain aspects of this Disclosure.
Figure 6:
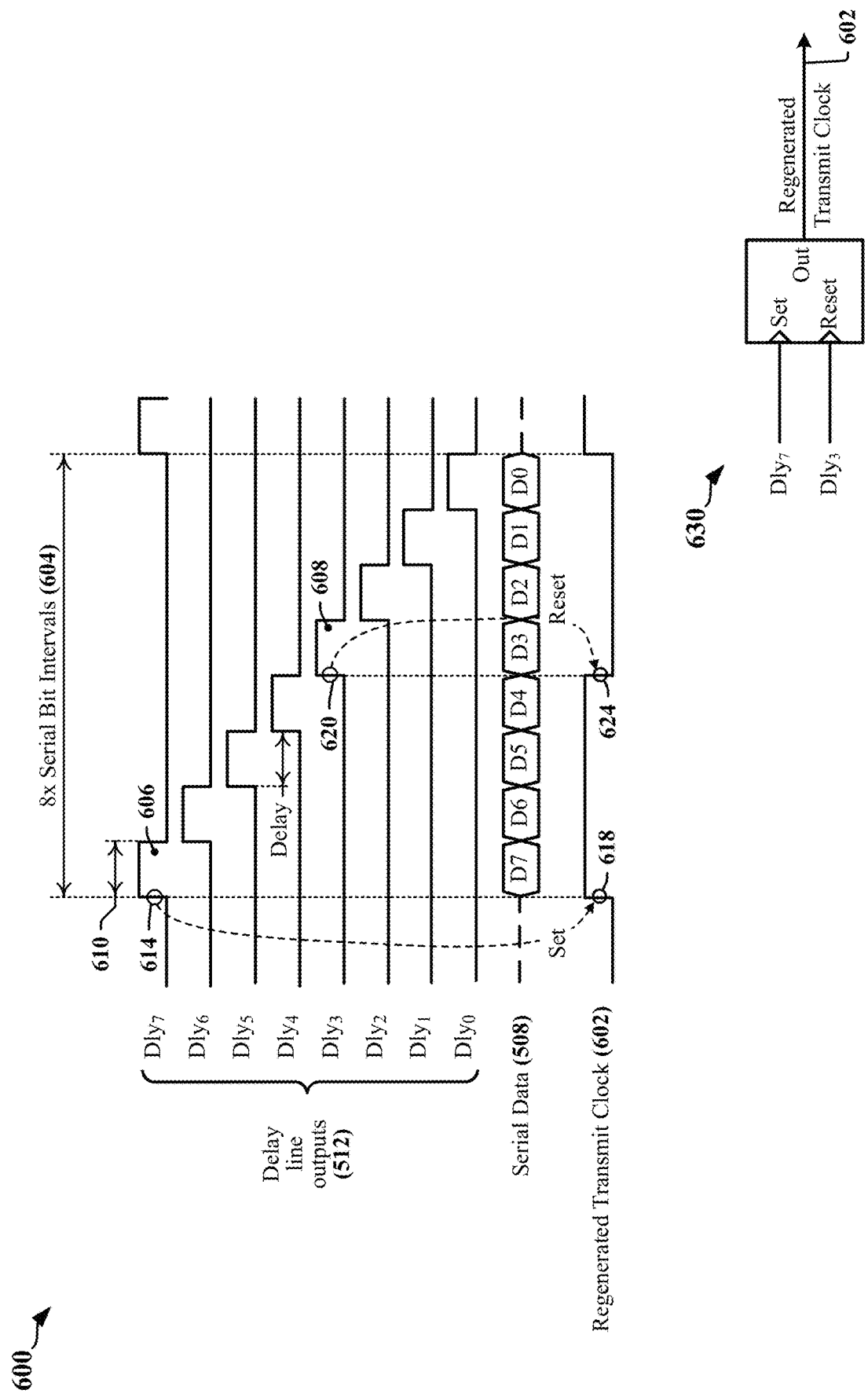
FIG. 6 illustrates certain aspects of the timing of signals generated or used by the serializer in FIG. 5.

FIG. 5 illustrates a serializer 500 configured in accordance with certain aspects of this disclosure FIG. 6 includes a timing diagram 600 that illustrates certain aspects of the timing of signals generated or used by the serializer 500 in FIG. 5. The serializer 500 includes a delay line 502 and a set of buffers 506. The delay line 502 may correspond to the delay line 400 illustrated in FIG. 4. The delay line 502 may operate in a manner similar to the delay line 400. The illustrated delay line 502 outputs eight delayed versions of a signal in response to edges in a transmit clock signal (TxClock 510) that is coupled to the input of the delay line 502. TxClock 510 may have a period 604 that corresponds to eight bit-transmission intervals 610.

Each of the delay line outputs 512 serves as an enable signal to one of the set of buffers 506. As a leading edge in TxClock 510 propagates through the delay line 502, a pulse is provided at each of the delay line outputs 512 in sequence. Nominally, at any given time only one of the delay line outputs 512 is high or otherwise in an active state. When one of the delay line outputs 512 is high or otherwise in an active state, a corresponding one of the set of buffers 506 is turned on and drives the input of a line driver 508. The line driver 508 is configured to drive the serial data line 518. In the illustrated serializer 500, each buffer in the set of buffers 506 is implemented using a tri-state buffer that has an input, an output and an enable input. The output of each buffer follows the input when the buffer is enabled. The output of each buffer is in a high impedance state when the buffer is disabled.

In one example, the $Dly_7$ output of the delay line 502 is coupled to an enable input of buffer 514 in the set of buffers 506 and a pulse 606 on the $Dly_7$ output selects the D7 data bit provided by the data source 504 for transmission over the serial data line 518. In another example, the $Dly_3$ output of the delay line 502 is coupled to an enable control input of buffer 516 in the set of buffers 506 and a pulse 608 on the $Dly_3$ output selects the D3 data bit provided by the data source 504 for transmission over the serial data line 518. The delay line outputs 512 operate to control the set of buffers 506 such that each bit from the data source 504 is sequentially transmitted over the serial data line 518, as illustrated by the signal transmitted on the serial data line 518 shown in FIG. 6. Of the data source 504, the set of buffers 506 and the line driver 508, only the line driver 508 is actively switching for all of the transmission of the 8-bit serial data.

In other aspects of this disclosure, the serializer 500 can be configured to derive a regenerated transmit clock signal 602 from the delay line outputs 512. In some implementations, the regenerated transmit clock signal 602 may be generated using a set-reset circuit 630, one example of which is also illustrated in FIG. 6. In the illustrated set-reset circuit 630, a rising edge 614 of the pulse 606 on the $Dly_7$ output of the delay line 502 sets the output of the set-reset circuit 630 and produces a rising edge 618 in the regenerated transmit clock signal 602. A rising edge 620 on the $Dly_3$ output of the delay line 502 resets the output of the set-reset circuit 630 and produces a falling edge 624 in the regenerated transmit clock signal 602. This combination of set and reset produces the regenerated transmit clock signal 602 with a period 604 corresponding to eight bit-transmission intervals 610 and having edges 618 and 624 that are synchronized to certain edges in the delay line outputs 512. The synchronization of the edges 618 and 624 in the regenerated transmit clock signal 602 prevents accumulation of jitter beyond each half cycle of the regenerated transmit clock signal 602. In some implementations, the regenerated transmit clock signal 602 may be generated using combinational logic. For example, the regenerated transmit clock signal 602 may be obtained by performing an OR function on four of the eight delay line outputs 512.

Figure 7:
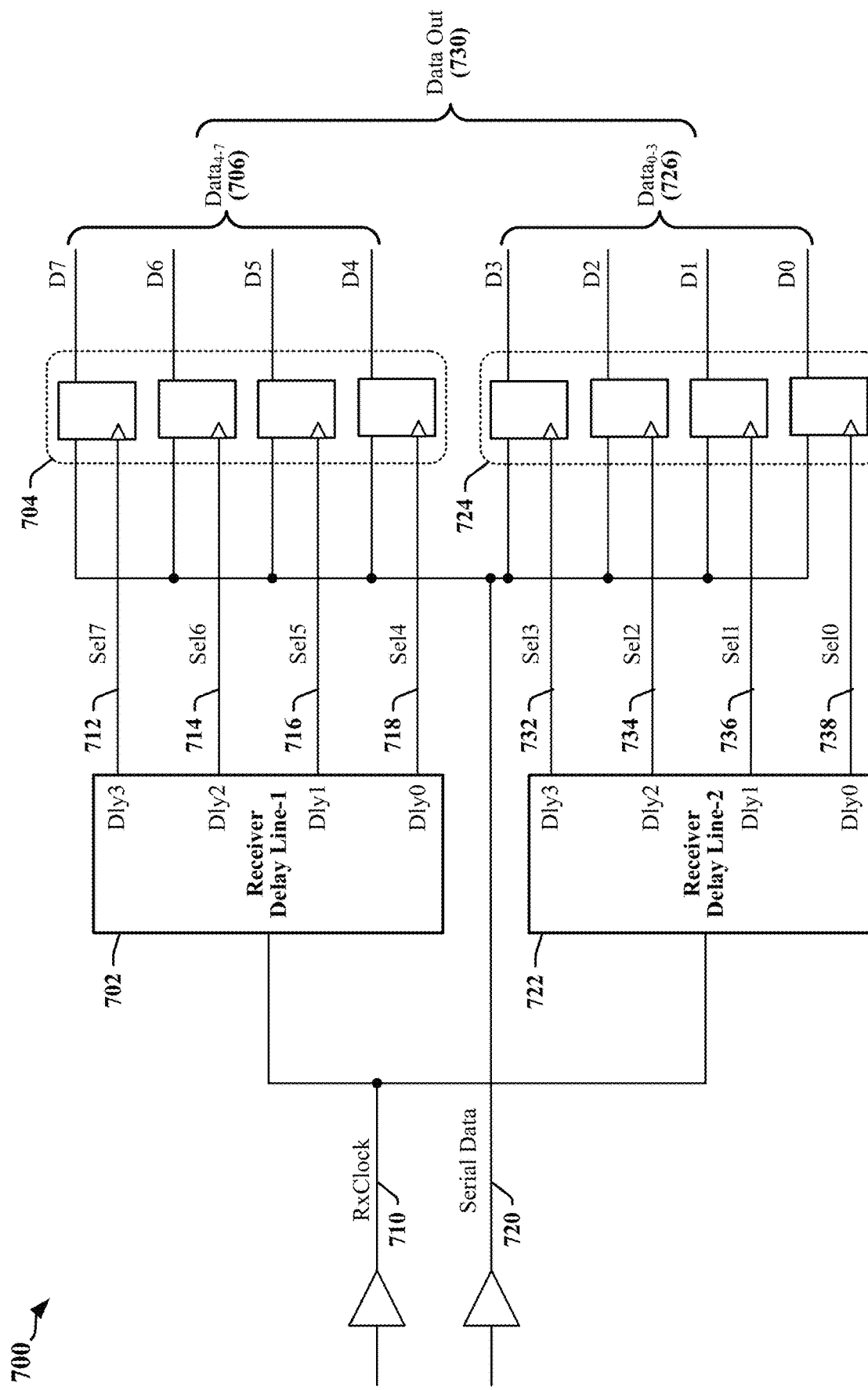
FIG. 7 illustrates a deserializer configured in accordance with certain aspects of this disclosure.
Figure 8:
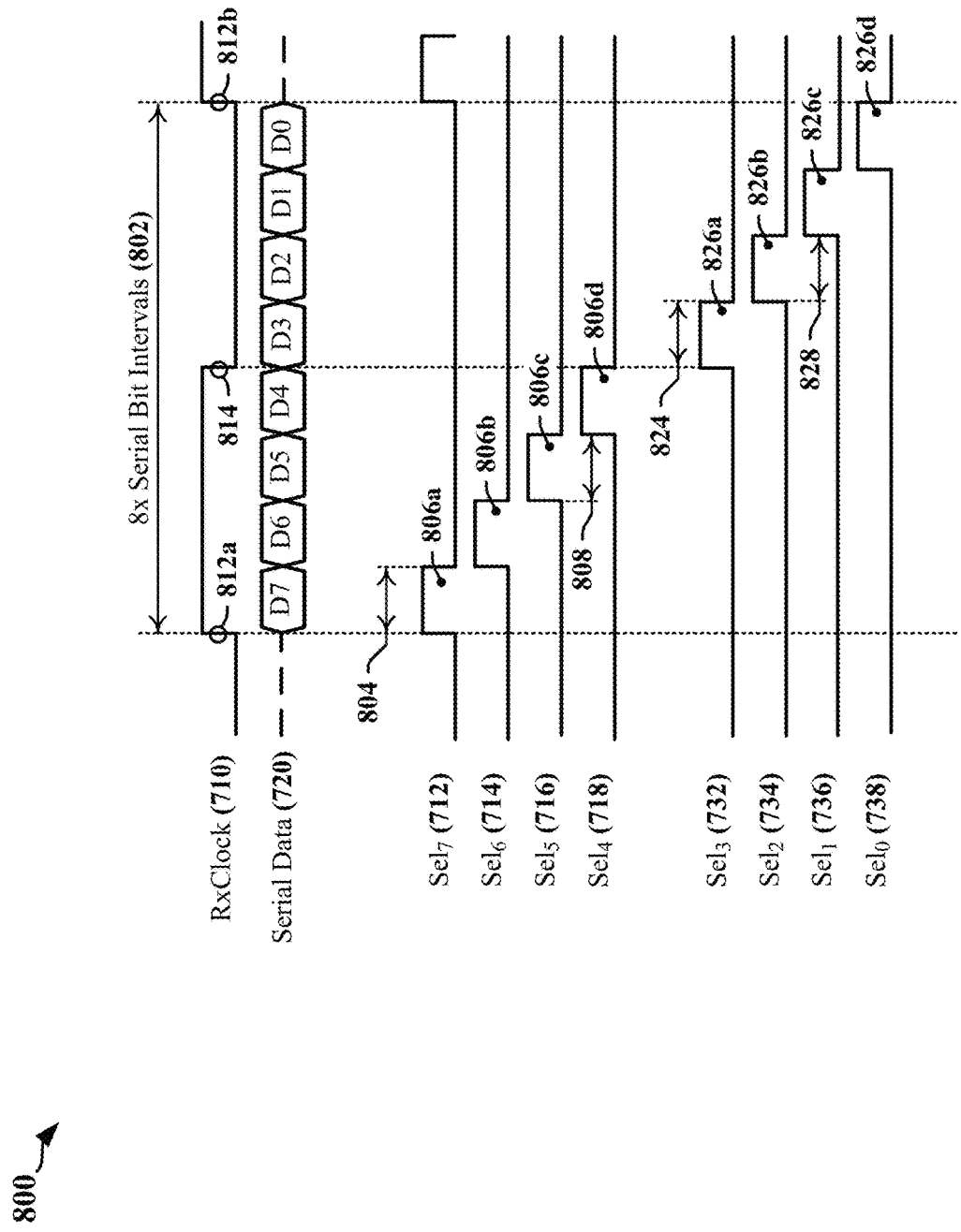
FIG. 8 is a timing diagram that illustrates certain aspects of the timing of signals generated or used by the deserializer in FIG. 7.

FIG. 7 illustrates a deserializer 700 configured in accordance with certain aspects of this disclosure FIG. 8 is a timing diagram 800 that illustrates certain aspects of the timing of signals generated or used by the deserializer 700 in FIG. 7. The deserializer 700 includes a pair of delay lines 702, 722 and two sets of latches 704, 724. The structure of the delay lines 702, 722 may relate in some respects to the structure of the delay line 400 illustrated in FIG. 4. Each of the delay lines 702, 722 outputs four delayed versions of a signal that is generated in response to edges in a receive clock signal (RxClock 710). RxClock 710 may be received with a serial data signal 720 from a serial communication link. In the illustrated example, the inputs of the delay lines 702, 722 are coupled to RxClock 710. In some instances, RxClock 710 is a received version of the regenerated transmit clock signal 602 forwarded by the serializer 500 illustrated in FIG. 5. The latches in the two sets of latches 704, 724 may be referred to as transparent latches. When enabled by its associated select signal 712, 714, 716, 718, 732, 734, 736, 738, the output of each transparent latch follows its input and holds the output state after the latch is disabled. The latches in the two sets of latches 704, 724 may also be referred to as asynchronous latches because the output can change without reference to an edge in a clock signal. In some implementations, the sets of latches 704, 724 may be replaced by a set of flipflops, where the output changes in response to an edge in the associated select signal 712, 714, 716, 718, 732, 734, 736, 738.

According to certain aspects of this disclosure, the first delay line 702 generates pulses 806a-806d in response to a rising edge 812a in RxClock 710. The pulses 806a-806d are generated with a duration 804 that closely matches the delay duration 808 provided by each stage of the first delay line 702. The pulses 806a-806d may be generated as described in relation to the delay line 400 illustrated in FIG. 4. For example, each pulse may be terminated after one delay duration 808 attributable to the delay elements in the first delay line 702. In the illustrated example, the total duration in which a pulse 806a-806d is output by the first delay line 702 corresponds to half the period of RxClock 710.

Each of the four select signals 712, 714, 716, 718 output by the first delay line 702 controls the operation of a corresponding latch in the first set of latches 704. A high signaling state on a select signal 712, 714, 716, 718 enables the corresponding latch to capture the state of the serial data signal 720. Pulses in the select signals 712, 714, 716, 718 are configured to enable each latch in the first set of latches 704 to capture a designated bit in the data stream encoded in the serial data signal 720. The first set of latches 704 is configured to capture data bits D7-D4 from the serial data signal 720.

According to certain aspects of this disclosure, the second delay line 722 generates pulses 826a-826d in response to a falling edge 812a in RxClock 710. In some instances, the first delay line 702 and the second delay line 722 have identical designs and configurations except that the second delay line 722 inverts its input or receives an inverted version of RxClock 710. In one example, the second delay line 722 may invert its input using an input inverter such as the phase select inverter 412 illustrated in FIG. 4. The second delay line 722 generates pulses 826a-826d with a duration 824 that closely matches the delay duration 828 provided by each stage of the second delay line 722. The pulses 826a-826d may be generated as described in relation to the delay line 400 illustrated in FIG. 4. For example, each pulse may be terminated after one delay duration 828 attributable to the delay elements in the second delay line 722. In the illustrated example, the total duration in which a pulse 826a-826d is output by the second delay line 722 corresponds to half the period of RxClock 710.

Each of the four select signals 732, 734, 736, 738 output by the second delay line 722 controls the operation of a corresponding latch in the second set of latches 724. A high signaling state on a select signal 732, 734, 736, 738 enables the corresponding latch to capture the state of the serial data signal 720. Pulses in the select signals 732, 734, 736, 738 are configured to enable each latch in the second set of latches 724 to capture a designated bit in the data stream encoded in the serial data signal 720. The second set of latches 724 is configured to capture data bits D3-D0 from the serial data signal 720.

Each of the two sets of latches 704, 724 provides an output 706, 726 that represents four bits of the eight-bit serial transmission associated with each cycle of RxClock 710. The outputs 706, 726 of the two sets of latches 704, 724 can be combined to provide an 8-bit data output 730 of the deserializer 700.

The use of two delay lines 702, 722 triggered by alternate edges in RxClock 710 can limit jitter accumulation to a half-cycle of the RxClock 710. The deserializer 700 operates without the need for serially connected flipflops and can be characterized by substantially reduced power consumption.

Figure 9:
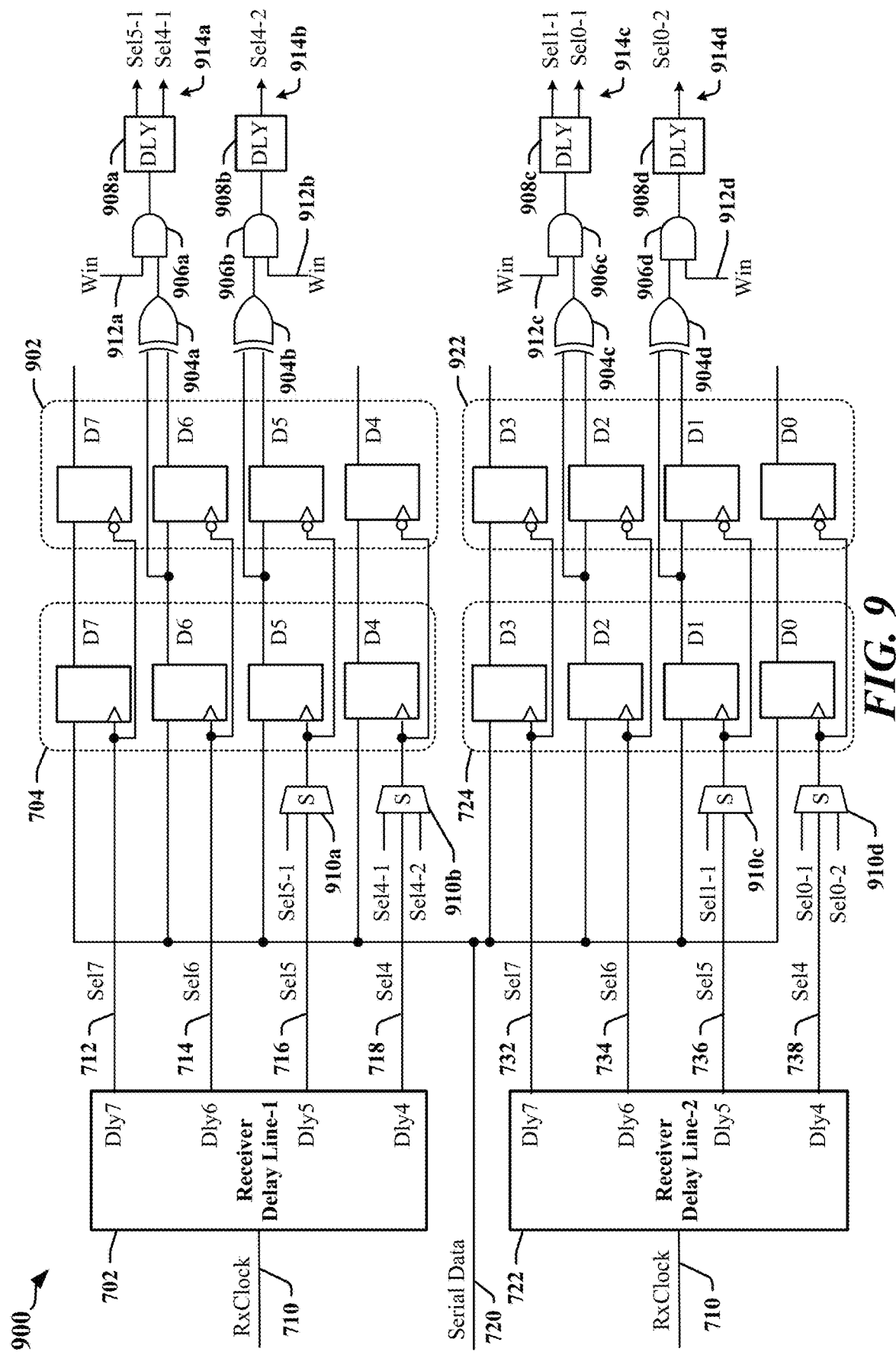
FIG. 9 illustrates a deserializer with clock edge regeneration configured in accordance with certain aspects of this disclosure.

FIG. 9 illustrates a deserializer 900 with clock edge regeneration configured in accordance with certain aspects of this disclosure. In the illustrated example, data transitions are used to extract clock edge information from the deserializer 700 illustrated in FIG. 7. Deserializer 900 operates in the same manner as deserializer 700 with the exception that certain latch enable signaling can be selected based on edges detected in the data stream received from the serial data signal 720.

In the illustrated deserializer 900, edge detection in the serial data signal 720 is supported for transitions between the D7 and D6 bit positions, the D6 and D5 bit positions, the D3 and D2 bit positions, and the D2 and D1 bit positions. Two sets of secondary latches 902, 922 are controlled by the inverse of the corresponding select signals 712, 714, 716, 718, 732, 734, 736, 738 output by the delay line 702 or 722. The sets of secondary latches 902, 922 are configured to maintain a copy of the output of the original sets of latches 704, 724 in a previous bit-transmission interval. For convenience, the original sets of latches 704, 724 may be referred to as the primary latches 704, 724, and the two sets of secondary latches 902, 922 may be referred to as the secondary latches. In the illustrated example, the secondary latches 902, 922 are enabled when the primary latches 704, 724 are disabled and the primary latches 704, 724 are enabled when the secondary latches 902, 922 are disabled.

When enabled, the primary latches 704, 724 follow the state of the serial data signal 720. Each of the primary latches 704, 724 is enabled during the bit-transmission interval that corresponds to the data bit to be captured. Exclusive-OR gates 904a-904d may be configured to detect a transition in the serial data signal 720. The outputs of the Exclusive-OR gates 904a-904d are gated by the corresponding window signals 912a-912c using AND gates 906a-906d. The window signals 912a-912c block the outputs of the Exclusive-OR gates 904a-904d except during time intervals when associated transitions in the serial data signal 720 are expected. Transitions in the serial data signal 720 generate pulses in the signals output by the AND gates 906a-906d and these pulses are fed to delay lines 908a-908d. The delay lines provide enabling signals 914a-914d that can be used instead of certain of the select signals 712, 714, 716, 718, 732, 734, 736, 738 output by the delay lines 702, 722. Certain delay lines 908a, 908c provide two delayed outputs that can be used as gate signals for two subsequent bit intervals.

The deserializer 900 includes multiplexers 910a-910d or other logic circuits that can select between the select signals 712, 714, 716, 718 output by the delay lines 702, 722 and select signals 914a-914d generated using the delay lines 908a-908d. Clock edge regeneration from data-edge information can limit jitter accumulation to 2 delay stages in the delay lines 702, 722. Accumulation of jitter can occur in the outputs of the delay lines 702 or 722 because of the effects of variations in temperature or voltage on the delay stages, for example. The select signals 914a-914d generated from data edges can provide timing information that is more current than the timing information generated from edges 812a, 814 in RxClock 710, thereby limiting the number of bit intervals over which jitter can accumulate.

Figure 10:
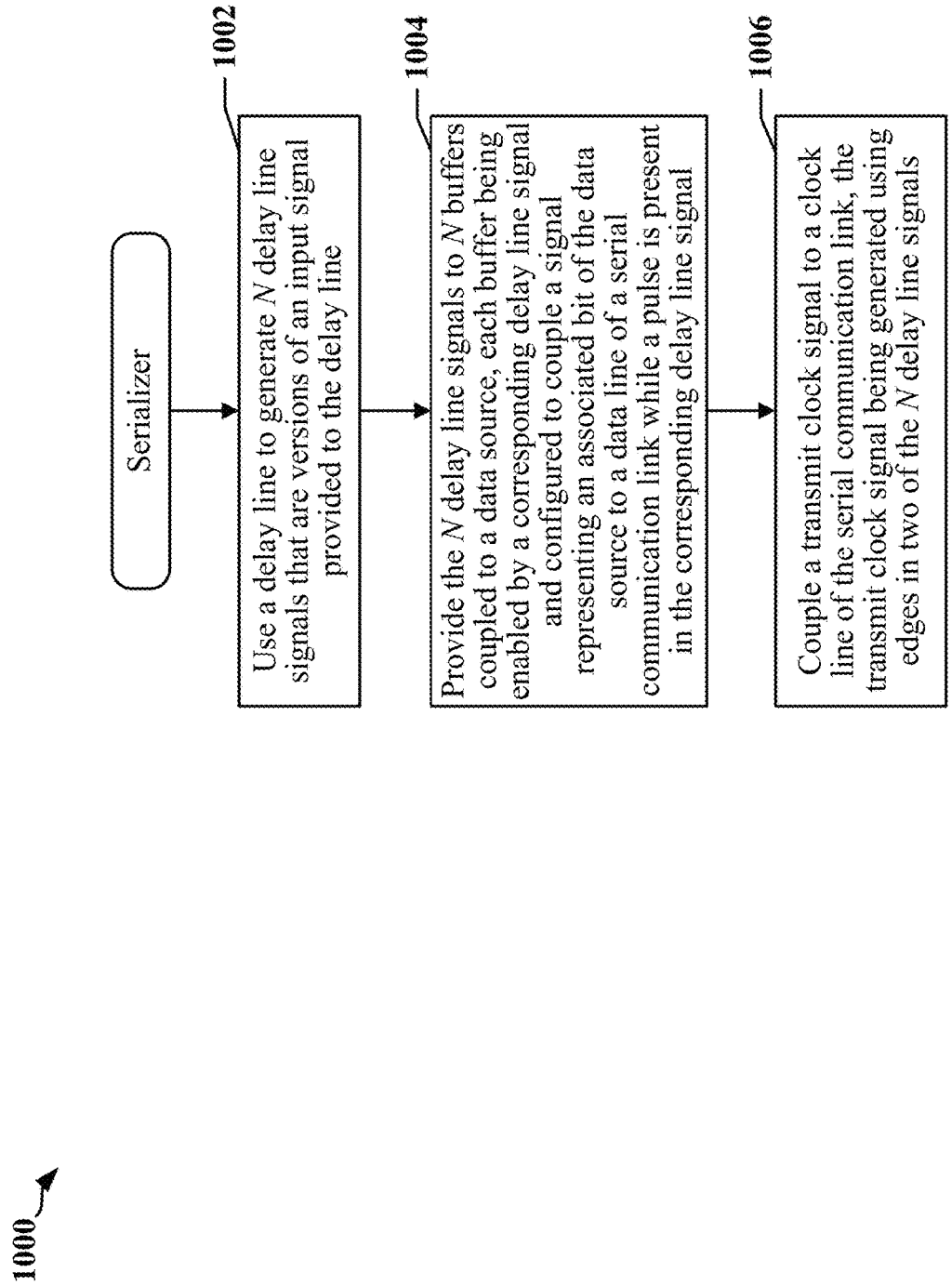
FIG. 10 is a flowchart illustrating an example of a method for serializing data in accordance with certain aspects of this disclosure.

FIG. 10 is a flowchart illustrating an example of a method 1000 for serializing data in accordance with certain aspects of this disclosure. The method 1000 may be implemented in an IC device and used for communicating data between the IC device and another IC device. In one example, the transmitting IC device and the receiving IC device are embodied in die on a chip carrier. The method may relate to certain aspects of this disclosure as described in regard to FIGS. 3-6 for example. At block 1002, a delay line may be used to generate N delay line signals that are versions of an input signal provided to the delay line. At block 1004, the N delay line signals may be provided to a plurality of buffers coupled to a data source. Each buffer in the plurality of buffers may be enabled by a corresponding delay line signal. Each buffer in the plurality of buffers may be configured to couple a signal representing an associated bit from the data source to a data line of a serial communication link while a pulse is present in the corresponding delay line signal. At block 1006, a transmit clock signal may be coupled to a clock line of the serial communication link, the transmit clock signal being generated using edges in two of the N delay line signals.

In various examples, the input signal includes pulses that repeat with a frequency corresponding to the frequency of the transmit clock signal. The input signal may include pulses that have a duration that corresponds to 1/Nth of a period of the transmit clock signal. Pulses in the input signal may be generated with a duration that corresponds to 1/Nth of a period of the transmit clock signal. 18. In some instances, N represents a number of bits in a parallel unit of data received from the data source for transmission over the serial communication link.

In certain examples, the delay line includes a plurality of serially-coupled delay stages. Each delay stage in the plurality of serially-coupled delay stages may be configured to delay a signal conducted between an input and an output of the delay stage by a duration that corresponds to 1/Nth of a period of the transmit clock signal. At least one delay stage in the plurality of serially-coupled delay stages may be configured to delay a signal conducted between an input and an output of the at least one delay stage by a calibratable duration. For example, the duration of a delay introduced by a delay stage may be calibratable using a variable capacitance, resistance or by controlling a bias current provided to a transistor. Pulses in each of the N delay line signals can have a duration that corresponds to 1/Nth of a period of the transmit clock signal. Leading edges of pulses output by each of a sequential pair of serially-coupled delay stages in the delay line may be separated by a duration that corresponds to 1/Nth of the period of the transmit clock signal.

In some examples, each buffer in the plurality of buffers is configured to cause its output to present a high impedance to an input of a line driver while the pulse is not present in the corresponding delay line signal. An output of each buffer in the plurality of buffers is coupled to the input of the line driver. An output of the line driver is configured to be coupled to the data line of the serial communication link.

Figure 11:
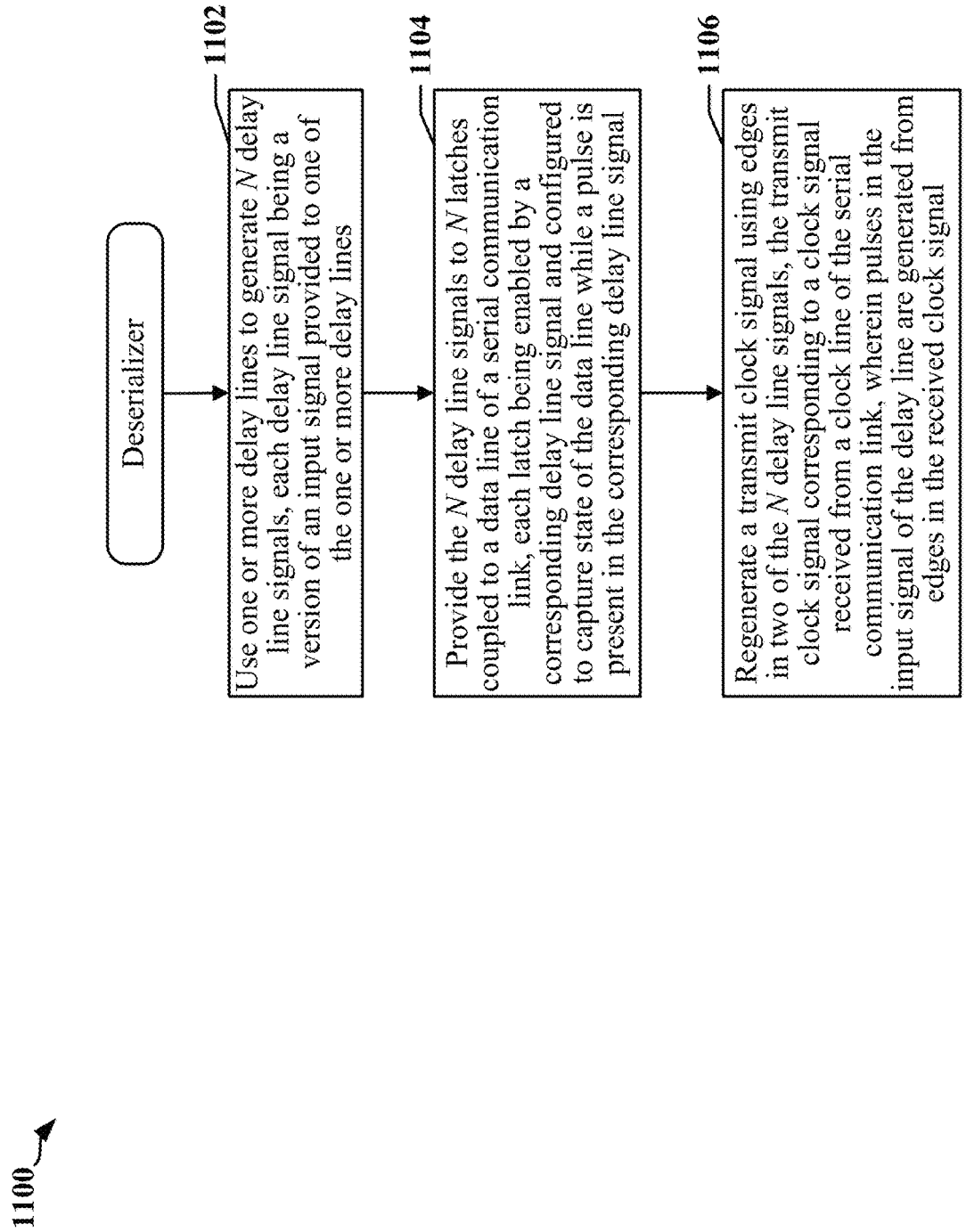
FIG. 11 is a flowchart illustrating an example of a method for deserializing data in accordance with certain aspects of this disclosure.

FIG. 11 is a flowchart illustrating an example of a method 1000 for deserializing data in accordance with certain aspects of this disclosure. The method 1100 may be implemented in an IC device and used for communicating data between the IC device and another IC device. In one example, the transmitting IC device and the receiving IC device are embodied in die on a chip carrier. The method may relate to certain aspects of this disclosure as described in regard to FIGS. 7-9 for example. At block 1102, one or more delay lines may be used to generate N delay line signals. Each delay line signal is a version of an input signal provided to one of the one or more delay lines. At block 1104, the N delay line signals may be provided to N latches coupled to a data line of a serial communication link. Each latch may be enabled by a corresponding delay line signal and configured to capture state of the data line while a pulse is present in the corresponding delay line signal. At block 1106, a transmit clock signal may be regenerated using edges in two of the N delay line signals. The transmit clock signal may correspond to a clock signal received from a clock line of the serial communication link. Pulses in the input signal of the delay line are generated from edges in the received clock signal.

In certain examples, pulses in a first input signal may be generated in response to rising edges in the received clock signal. The pulses in the first input signal may have a duration that corresponds to 1/Nth of a period of the transmit clock signal. A first delay line may be used to generate a first N/2 of the delay line signals as versions of the first input signal. Pulses in a second input signal may be generated in response to falling edges in the received clock signal. The pulses in the second input signal may have a duration that corresponds to 1/Nth of the period of the transmit clock signal. A second delay line may be used to generate a second N/2 of the delay line signals as versions of the second input signal.

In some examples, in the first N/2 of the delay line signals terminate within a first half-cycle of the transmit clock signal, and pulses in the second N/2 of the delay line signals terminate within a second half-cycle of the transmit clock signal. The first input signal and the second input signal may each include pulses that have a duration that corresponds to 1/Nth of the period of the transmit clock signal.

In certain implementations, the one or more delay lines include a plurality of serially-coupled delay stages. Each delay stage in the plurality of serially-coupled delay stages may be configured to delay a signal conducted between an input and an output of the delay stage by a duration that corresponds to 1/Nth of a period of the transmit clock signal. At least one delay stage delay stage in the plurality of serially-coupled delay stages may be configured to delay a signal conducted between an input and an output of the at least one delay stage by a calibratable duration. Pulses in each of the N delay line signals can have a duration that corresponds to 1/Nth of a period of the transmit clock signal. Leading edges of pulses output by each of a sequential pair of serially-coupled delay stages may be separated by have a duration that corresponds to 1/Nth of the period of the transmit clock signal.

Some implementation examples are described in the following numbered clauses:

1. A serializer, comprising: a delay line having a plurality of serially-coupled delay stages, the delay line being configured to output N delay line signals that are versions of an input signal and that include outputs of the plurality of serially-coupled delay stages; a plurality of buffers coupled to a data source, each buffer being enabled by a corresponding delay line signal and configured to couple a signal representing an associated bit from the data source to a data line of a serial communication link while a pulse is present in the corresponding delay line signal; and a clock generation circuit responsive to edges in two of the N delay line signals and configured to generate a transmit clock signal to be transmitted over a clock line of the serial communication link.
2. The serializer as described in claim 1, wherein the input signal comprises pulses that repeat with a frequency corresponding to the frequency of the transmit clock signal.
3. The serializer as described in claim 1 or claim 2, wherein the input signal comprises pulses that have a duration that corresponds to 1/Nth of a period of the transmit clock signal.
4. The serializer as described in any of claims 1-3, further comprising: a pulse generation circuit configured to generate pulses in the input signal that have a duration that corresponds to 1/Nth of a period of the transmit clock signal.
5. The serializer as described in any of claims 1-4, wherein each delay stage in the plurality of serially-coupled delay stages is configured to delay a signal conducted between an input and an output of the each delay stage by a duration that corresponds to 1/Nth of a period of the transmit clock signal.
6. The serializer as described in any of clauses 1-5, wherein at least one delay stage in the plurality of serially-coupled delay stages is configured to delay a signal conducted between an input and an output of the at least one delay stage by a calibratable duration.
7. The serializer as described in any of clauses 1-6, wherein pulses in each of the N delay line signals have a duration that corresponds to 1/Nth of a period of the transmit clock signal and wherein leading edges of pulses output by each of a sequential pair of the plurality of serially-coupled delay stages are separated by a duration that corresponds to 1/Nth of a period of the transmit clock signal.
8. The serializer as described in any of clauses 1-7, further comprising: a line driver having an input coupled to an output of each buffer in the plurality of buffers and an output that is configured to be coupled to the data line of the serial communication link, wherein each buffer in the plurality of buffers is configured to cause its output to present a high impedance to the input of the line driver while the pulse is not present in the corresponding delay line signal.
9. The serializer as described in any of clauses 1-8, wherein N represents a number of bits in a parallel unit of data received from the data source for transmission by the serializer over the serial communication link.
10. A method for serializing data, comprising: using a delay line to generate N delay line signals that are versions of an input signal provided to the delay line; providing the N delay line signals to a plurality of buffers coupled to a data source, each buffer in the plurality of buffers being enabled by a corresponding delay line signal and configured to couple a signal representing an associated bit from the data source to a data line of a serial communication link while a pulse is present in the corresponding delay line signal; and coupling a transmit clock signal to a clock line of the serial communication link, the transmit clock signal being generated using edges in two of the N delay line signals.
11. The method as described in clause 10, wherein the input signal comprises pulses that repeat with a frequency corresponding to the frequency of the transmit clock signal.
12. The method as described in clause 10 or clause 11, wherein the input signal comprises pulses that have a duration that corresponds to 1/Nth of a period of the transmit clock signal.
13. The method as described in any of clauses 10-12, further comprising: generating pulses in the input signal that have a duration that corresponds to 1/Nth of a period of the transmit clock signal.

14. The method as described in any of clauses 10-13, wherein the delay line includes a plurality of serially-coupled delay stages, each delay stage in the plurality of serially-coupled delay stages being configured to delay a signal conducted between an input and an output of the each delay stage by a duration that corresponds to 1/Nth of a period of the transmit clock signal.

15. The method as described in any of clauses 10-14, wherein the delay line includes a plurality of serially-coupled delay stages, at least one delay stage in the plurality of serially-coupled delay stages being configured to delay a signal conducted between an input and an output of the at least one delay stage by a calibratable duration.

16. The method as described in any of clauses 10-15, wherein pulses in each of the N delay line signals have a duration that corresponds to 1/Nth of a period of the transmit clock signal and wherein leading edges of pulses output by each of a sequential pair of serially-coupled delay stages in the delay line are separated by a duration that corresponds to 1/Nth of the period of the transmit clock signal.

17. The method as described in any of clauses 10-16, wherein each buffer in the plurality of buffers is configured to cause its output to present a high impedance to an input of a line driver while the pulse is not present in the corresponding delay line signal, and wherein an output of each buffer in the plurality of buffers is coupled to the input of the line driver, and wherein an output of the line driver is configured to be coupled to the data line of the serial communication link.

18. The method as described in clause 17, wherein N represents a number of bits in a parallel unit of data received from the data source for transmission over the serial communication link.

19. A deserializer, comprising: one or more delay lines configured to output N delay line signals, each delay line signal being a version of an input signal provided to one of the one or more delay lines; a plurality of latches coupled to a data line of a serial communication link, each latch being enabled by a corresponding one of the N delay line signals and configured to capture state of the data line while a pulse is present in the corresponding delay line signal; and a clock generation circuit configured to produce a regenerated transmit clock signal using edges in two of the N delay line signals, the regenerated transmit clock signal corresponding to a clock signal received from a clock line of the serial communication link, wherein pulses in the input signal of each of the one or more delay lines are generated from edges in the received clock signal.

20. The deserializer as described in clause 19, wherein the deserializer comprises: a first pulse generation circuit configured to generate pulses in a first input signal responsive to rising edges in the received clock signal, the pulses in the first input signal having a duration that corresponds to 1/Nth of a period of the transmit clock signal; a second pulse generation circuit configured to generate pulses in a second input signal responsive to falling edges in the received clock signal, the pulses in the second input signal having a duration that corresponds to 1/Nth of the period of the transmit clock signal; a first delay line configured to receive the first input signal and to output a first N/2 of the delay line signals; and a second delay line configured to receive the second input signal and to output a second N/2 of the delay line signals.

21. The deserializer as described in clause 19 or clause 20, wherein pulses in the first N/2 of the delay line signals terminate within a first half-cycle of the transmit clock signal, and wherein pulses in the second N/2 of the delay line signals terminate within a second half-cycle of the transmit clock signal, and wherein the each of the first input signal and the second input signal comprises pulses that have a duration that corresponds to 1/Nth of the period of the transmit clock signal.

22. The deserializer as described in any of clauses 19-21, wherein the one or more delay lines comprise a plurality of serially-coupled delay stages in which each delay stage is configured to delay a signal conducted between an input and an output of the each delay stage by a duration that corresponds to 1/Nth of a period of the transmit clock signal.

23. The deserializer as described in any of clauses 19-22, wherein the one or more delay lines comprise a plurality of serially-coupled delay stages in which at least one delay stage in the plurality of serially-coupled delay stages is configured to delay a signal conducted between an input and an output of the at least one delay stage by a calibratable duration.

24. The deserializer as described in any of clauses 19-23, wherein pulses in each of the N delay line signals have a duration that corresponds to 1/Nth of a period of the transmit clock signal, and wherein the one or more delay lines comprise a plurality of serially-coupled delay stages in which leading edges of pulses output by each of a sequential pair of the plurality of serially-coupled delay stages are separated by a duration that corresponds to 1/Nth of the period of the transmit clock signal.

25. A method for deserializing data, comprising: using one or more delay lines to generate N delay line signals, each delay line signal being a version of an input signal provided to one of the one or more delay lines; providing the N delay line signals to N latches coupled to a data line of a serial communication link, each latch being enabled by a corresponding delay line signal and configured to capture state of the data line while a pulse is present in the corresponding delay line signal; and regenerating a transmit clock signal using edges in two of the N delay line signals, the transmit clock signal corresponding to a clock signal received from a clock line of the serial communication link, wherein pulses in the input signal of the delay line are generated from edges in the received clock signal.

26. The method as described in clause 25, further comprising: generating pulses in a first input signal responsive to rising edges in the received clock signal, the pulses in the first input signal having a duration that corresponds to 1/Nth of a period of the transmit clock signal; generating pulses in a second input signal responsive to falling edges in the received clock signal, the pulses in the second input signal having a duration that corresponds to 1/Nth of the period of the transmit clock signal; using a first delay line to generate a first N/2 of the delay line signals as versions of the first input signal; and using a second delay line to generate a second N/2 of the delay line signals as versions of the second input signal.

27. The method as described in clause 25 or clause 26, wherein pulses in the first N/2 of the delay line signals terminate within a first half-cycle of the transmit clock signal, and wherein pulses in the second N/2 of the delay line signals terminate within a second half-cycle of the transmit clock signal, and wherein the each of the first input signal and the second input signal comprises pulses that have a duration that corresponds to 1/Nth of the period of the transmit clock signal.

28. The method as described in any of clauses 25-27, wherein the one or more delay lines comprise a plurality of serially-coupled delay stages, each delay stage in the plurality of serially-coupled delay stages being configured to delay a signal conducted between an input and an output of the each delay stage by a duration that corresponds to 1/Nth of a period of the transmit clock signal.

29. The method as described in any of clauses 25-28, wherein the one or more delay lines comprise a plurality of serially-coupled delay stages, at least one delay stage in the plurality of serially-coupled delay stages being configured to delay a signal conducted between an input and an output of the at least one delay stage by a calibratable duration.

30. The method as described in any of clauses 25-29, wherein pulses in each of the N delay line signals have a duration that corresponds to 1/Nth of a period of the transmit clock signal, and wherein the one or more delay lines comprise a plurality of serially-coupled delay stages in which leading edges of pulses output by each of a sequential pair of serially-coupled delay stages are separated by have a duration that corresponds to 1/Nth of the period of the transmit clock signal.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A serializer, comprising:
   a delay line including a plurality of pulse generation circuits, each pulse generation circuit being configured to provide a pulse in a corresponding one of N delay line signals generated by the delay line, where N is an integer greater than 1 and where each pulse generated by the plurality of pulse generation circuits has a duration that is 1/Nth of a period of a transmit clock signal received at an input of the delay line; and
   a plurality of buffers coupled to a data source, each buffer being enabled by pulses in a corresponding one of the N delay line signals and configured to couple a signal representing an associated bit from the data source to a data line of a serial communication link when enabled by the pulses in the corresponding delay line signal, wherein each pulse generation circuit includes a pulse control circuit configured to terminate pulses in its corresponding delay line signal at the leading edge of a pulse generated by a next-in-line pulse generation circuit.

2. The serializer of claim 1, further comprising:
   a clock generation circuit responsive to edges in two of the N delay line signals and configured to generate a bus clock signal to be transmitted over a clock line of the serial communication link.

3. The serializer of claim 1, wherein pulses generated by each of the plurality of pulse generation circuits repeat with a frequency corresponding to the frequency of the bus clock signal.

4. The serializer of claim 1, wherein a pulse is present on no more than one of the N delay line signals at any time.

5. The serializer of claim 1, further comprising:
   a line driver having an input coupled to an output of each buffer in the plurality of buffers and an output that is configured to be coupled to the data line of the serial communication link,
   wherein each buffer in the plurality of buffers is configured to disable its output from following its input when a pulse is not present in its corresponding delay line signal.

6. A deserializer, comprising:
   one or more receiver delay lines, each receiver delay line including a plurality of pulse generation circuits, each pulse generation circuit being configured to provide a pulse in a corresponding one of N control signals generated by the delay line from a bus clock signal received over a clock line of a serial communication link, wherein each pulse generated by the plurality of pulse generation circuits has a duration that is 1/Nth of a period of the bus clock signal; and
   a plurality of latches coupled to a data line of a serial communication link, each latch being enabled using one control signal in the N control signals and each latch being configured to capture state of the data line while a pulse is present in the one control signal.

7. The deserializer of claim 6, wherein a pulse is present on no more than one of the N control signals at any time.

8. The deserializer of claim 6, wherein the one or more receiver delay lines comprise:
   a first receiver delay line including a first plurality of pulse generation circuits configured to provide first pulses in a corresponding first plurality of the N control signals responsive to rising edges in the bus clock signal; and
   a second receiver delay line including a second plurality of pulse generation circuits configured to provide second pulses in a corresponding second plurality of the N control signals responsive to falling edges in the bus clock signal,
   wherein the first receiver delay line is configured to output a first N/2 of the N control signals, and
   wherein the second receiver delay line is configured to output a second N/2 of the N control.

9. The deserializer of claim 8, wherein pulses in the first N/2 of the N control signals terminate within a first half-cycle of the bus clock signal, and wherein pulses in the second N/2 of the N control signals terminate within a second half-cycle of the bus clock signal.

10. The deserializer of claim 6, further comprising:
    a multiplexer having an output coupled to an enabling input of one of the plurality of latches, a first selectable input coupled to one of the N control signals and at least one other selectable input coupled to a delayed control signal generated from edges detected in outputs of one or more latches in the plurality of latches.

11. A system, comprising:
a first die coupled to a serial communication link, a circuit on the first die including:
a transmitter delay line including a first plurality of pulse generation circuits, each pulse generation circuit being configured to provide pulses in a corresponding one of N transmit enable signals, where N is an integer greater than 1 and where each pulse generated by the first plurality of pulse generation circuits has a duration that is 1/Nth of a period of a transmit clock signal received at an input of the delay line; and
a plurality of buffers coupled to a data source, each buffer being enabled by a corresponding transmit enable signal and configured to couple a signal representing an associated bit from the data source to a data line of the serial communication link while a pulse is present in the corresponding transmit enable signal; and
a second die coupled to the serial communication link, a circuit on the second die including:
one or more receiver delay lines, each receiver delay line including a second plurality of pulse generation circuits, each pulse generation circuit being configured to provide a pulse in a corresponding one of N control signals generated by the delay line from a bus clock signal received over a clock line of a serial communication link, wherein each pulse generated by the second plurality of pulse generation circuits has a duration that is 1/Nth of a period of the bus clock signal; and
a plurality of latches coupled to the data line of a serial communication link, each latch being enabled using one control signal in the N control signals and being configured to capture state of the data line while a pulse is present in the one control signal.

12. The system of claim 11, wherein the circuit on the first die comprises:
a transmitter clock generation circuit responsive to edges in two of the N transmit enable signals and configured to generate a bus clock signal to be transmitted over the transmitter clock line of the serial communication link.

13. The system of claim 12, wherein pulses generated by each of the first plurality of pulse generation circuits repeat with a frequency corresponding to the frequency of the transmit clock signal.

14. The system of claim 11, wherein a pulse is present on no more than one of the N transmit enable signals at any time.

15. The system of claim 11, wherein the transmitter delay line comprises a plurality of serially-coupled delay stages in which at least one delay stage in the plurality of serially-coupled delay stages is configured to delay a signal conducted between an input and an output of the at least one delay stage by a calibratable duration.

16. The system of claim 15, wherein leading edges of pulses output by each of a sequential pair of the plurality of serially-coupled delay stages are separated by a duration that corresponds to 1/Nth of a period of the bus clock signal.

17. The system of claim 11, further comprising:
a line driver having an input coupled to an output of each buffer in the plurality of buffers and an output that is configured to be coupled to the data line of the serial communication link,
wherein each buffer in the plurality of buffers is configured to cause its output to present a high impedance to the input of the line driver while the pulse is not present in z corresponding transmit enable signal.

18. The system of claim 11, wherein N represents a number of bits in a parallel unit of data received from the data source for transmission over the serial communication link.

19. The system of claim 11, wherein the one or more receiver delay lines comprise:
a first receiver delay line including a first plurality of pulse generation circuits configured to provide first pulses in a corresponding first plurality of the N control signals responsive to rising edges in the bus clock signal; and
a second receiver delay line including a second plurality of pulse generation circuits configured to provide second pulses in a corresponding second plurality of the N control signals responsive to falling edges in the bus clock signal,
wherein the first receiver delay line is configured to output a first N/2 of the N control signals, and
wherein the second receiver delay line is configured to output a second N/2 of the N control.

20. The system of claim 19, wherein pulses in the first N/2 of the N control signals terminate within a first half-cycle of the bus clock signal, and wherein pulses in the second N/2 of the N control signals terminate within a second half-cycle of the bus clock signal.

21. The system of claim 11, wherein the circuit on the second die comprises:
a multiplexer having an output coupled to an enabling input of one of the plurality of latches, a first selectable input coupled to one of the N control signals and at least one other selectable input coupled to a delayed control signal generated from edges detected in outputs of one or more latches in the plurality of latches.

22. The system of claim 11, wherein the one or more receiver delay lines comprise a plurality of serially-coupled delay stages in which at least one delay stage in the plurality of serially-coupled delay stages is configured to delay a signal conducted between an input and an output of the at least one delay stage by a calibratable duration.

23. The system of claim 11, wherein the first die and the second die are provided on a chip carrier.

24. The system of claim 11, wherein the first die, the second die, and the serial communication link are provided within a chip package.

25. The system of claim 11, wherein the first die and the second die are coupled using a metallization trace that has a length measurable as one or more millimeters.

26. The system of claim 11, wherein the first die and the second die are coupled using a metallization trace that has a length measurable as a fraction of a millimeter.

27. The system of claim 11, wherein the transmitter delay line and the plurality of buffers are included in a serializer.

28. The system of claim 11, wherein the one or more receiver delay lines and the plurality of latches are included in a deserializer.

* * * * *